United States Patent
Payne

(10) Patent No.: US 8,891,717 B1
(45) Date of Patent: Nov. 18, 2014

(54) METHOD AND SYSTEM FOR COMPARING DIGITAL VALUES

(71) Applicant: Texas Instruments Incorporated, Dallas, TX (US)

(72) Inventor: Robert Floyd Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/954,424

(22) Filed: Jul. 30, 2013

(51) Int. Cl.
  *H03D 3/24* (2006.01)
  *H04L 7/00* (2006.01)
(52) U.S. Cl.
  CPC ............ *H04L 7/0087* (2013.01); *H04L 7/0037* (2013.01)
  USPC ........... 375/376; 327/147; 327/156; 375/294; 375/327; 375/373; 455/180.3
(58) Field of Classification Search
  None
  See application file for complete search history.

(56) References Cited

U.S. PATENT DOCUMENTS

| | | | |
|---|---|---|---|
| 3,908,181 A | * | 9/1975 | Shigaki et al. ................ 341/143 |
| 7,315,596 B2 | | 1/2008 | Payne et al. |
| 7,376,211 B2 | | 5/2008 | Payne et al. |

* cited by examiner

*Primary Examiner* — Adolf Dsouza
(74) *Attorney, Agent, or Firm* — Michael A. Davis, Jr.; Frederick J. Telecky, Jr.

(57) ABSTRACT

One bit is a smallest increment of binary measurement in first and second digital values. The first digital value is converted into a first analog signal. The second digital value is converted into a second analog signal. The first analog signal is augmented by a first amount that equates to less than the smallest increment of binary measurement, so that the augmented first analog signal by definition does not equal the second analog signal. The second analog signal is augmented by a second amount that equates to less than the smallest increment of binary measurement, so that the augmented second analog signal by definition does not equal the first analog signal. The augmented first analog signal is compared to the second analog signal, and a first signal is output in response thereto. The augmented second analog signal is compared to the first analog signal, and a second signal is output in response thereto. In response to the first and second signals, a determination is made about whether the first digital value is greater than the second digital value, whether the first digital value is less than the second digital value, and whether the first digital value is equal to the second digital value.

22 Claims, 3 Drawing Sheets

METHOD AND SYSTEM FOR COMPARING DIGITAL VALUES

BACKGROUND

The disclosures herein relate in general to electronic circuitry, and in particular to a method and system for comparing digital values.

In one example of asynchronously communicating a serial data stream from a transmitter to a receiver, the receiver implements a binary type of clock recovery technique, in which the receiver suitably adjusts a phase of its clock in response to phase differences between: (a) such clock; and (b) transitions in the data stream. In response to such clock having more "early" events than "late" events (within a particular number of consecutive bit times), the receiver delays the phase of such clock to make it less early. Conversely, in response to such clock having more "late" events than "early" events (within the particular number of consecutive bit times), the receiver advances the phase of such clock to make it less late.

To determine whether such clock has more "late" events than "early" events (within the particular number of consecutive bit times), some previous techniques have computed a total number of such "late" events, a total number of such "early" events, and a difference between those total numbers (including magnitude and sign of such difference). However, if the particular number of consecutive bit times is relatively large, then such techniques could impose a relatively large amount of combinational logic, which may be inefficient and cause the receiver to operate at lower frequency.

SUMMARY

One bit is a smallest increment of binary measurement in first and second digital values. The first digital value is converted into a first analog signal. The second digital value is converted into a second analog signal. The first analog signal is augmented by a first amount that equates to less than the smallest increment of binary measurement, so that the augmented first analog signal by definition does not equal the second analog signal. The second analog signal is augmented by a second amount that equates to less than the smallest increment of binary measurement, so that the augmented second analog signal by definition does not equal the first analog signal. The augmented first analog signal is compared to the second analog signal, and a first signal is output in response thereto. The augmented second analog signal is compared to the first analog signal, and a second signal is output in response thereto. In response to the first and second signals, a determination is made about whether the first digital value is greater than the second digital value, whether the first digital value is less than the second digital value, and whether the first digital value is equal to the second digital value.

DETAILED DESCRIPTION

Figure 1:
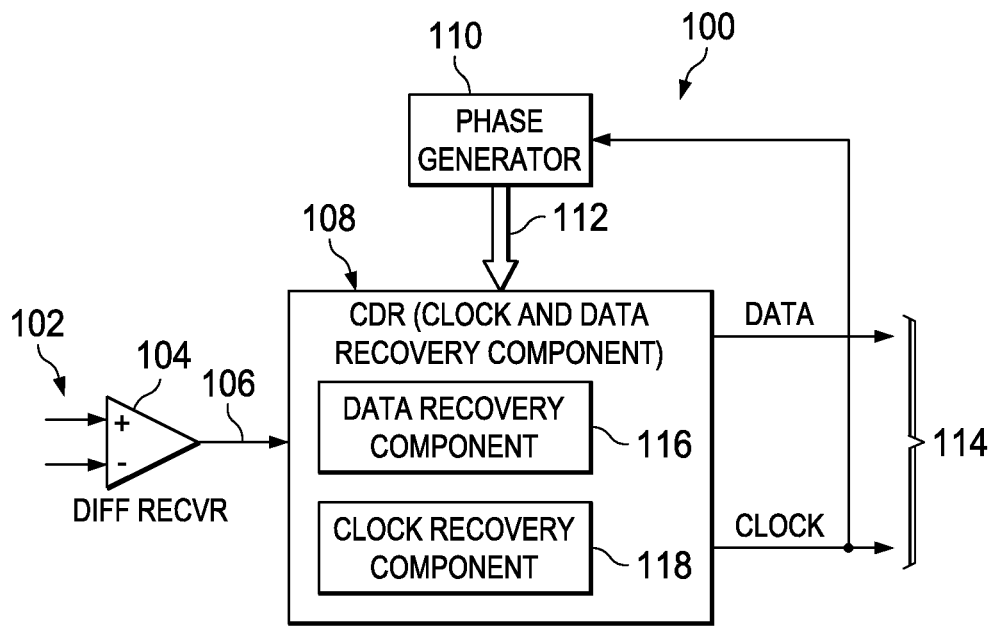
FIG. 1 is a block diagram of an example clock and data recovery system of the illustrative embodiments.

FIG. 1 is a block diagram of an example clock and data recovery ("CDR") system, indicated generally at 100, of the illustrative embodiments. Accordingly, the system 100 executes various processes and performs operations (e.g., processing and communicating information) in response thereto. The system 100 includes various electronic circuitry components (e.g., hardware, firmware and/or software) for performing the system 100 operations.

The system 100 receives a serial data stream 102, which is encoded with a suitable encoding scheme, such as non-return-to-zero inverted ("NRZI") encoding. The data stream 102 is asynchronously communicated to the system 100 from a transmitter. In response to the data stream 102, a differential receiver (or transceiver) 104 outputs a buffered or amplified serial data stream 106 to a CDR circuit 108. A phase generator 110 generates a local clock signal whose frequency is approximately the same as a clock of the transmitter that generated the data stream 102. The phase generator 110 outputs multiple phases 112 of the local clock signal.

The CDR circuit 108: (a) receives the data stream 106 and the clock phases 112; and (b) in response thereto, outputs signals 114 that include recovered data and one or more recovered clocks. A data recovery component 116 generates the recovered data by sampling and detecting transitions in the data stream 106. A clock recovery component 118 generates the one or more recovered clocks associated with the recovered data. In one embodiment, the data recovery component 116 and the clock recovery component 118 share one or more components and circuits, such as circuits for identifying transitions/data toggles.

For each bit in the data stream 106, the CDR circuit 108 attempts to sample: (a) a center of such bit in response to a data clock of the CDR circuit 108; and (b) edges of such bit in response to a transition clock of the CDR circuit 108. However, if non-ideal operating conditions (e.g., timing errors and jitter) affect those recovered clocks (e.g., the data clock and the transition clock), then: (a) the CDR circuit 108 might deviate away from sampling the center and edges of each bit; and (b) unless the CDR circuit 108 suitably adjusts phases of those clocks, such deviation might cause drift of those clocks and corruption of the recovered data. Accordingly, the CDR circuit 108 implements a binary type of clock recovery technique, in which the CDR circuit 108 suitably adjusts the phases of its recovered clocks in response to phase differences between: (a) those clocks; and (b) transitions in the data stream 106.

Figure 2:
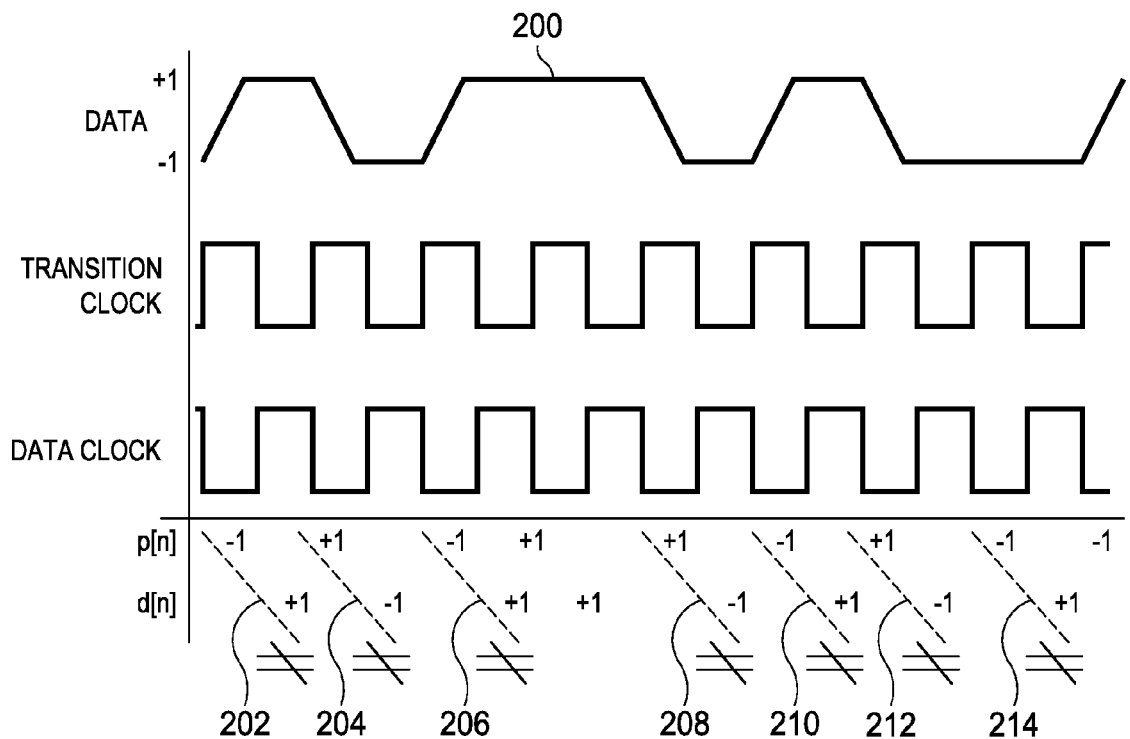
FIG. 2 is a timing diagram of an example operation in which recovered clocks are early.

FIG. 2 is a timing diagram of an example operation in which recovered clocks of the CDR circuit 108 are early. The diagram of FIG. 2 spans eight (8) consecutive bit times across a horizontal axis of increasing time (left to right) for a data stream 200, a transition clock, a data clock, edge samples p[n], and center samples d[n].

Figure 3:
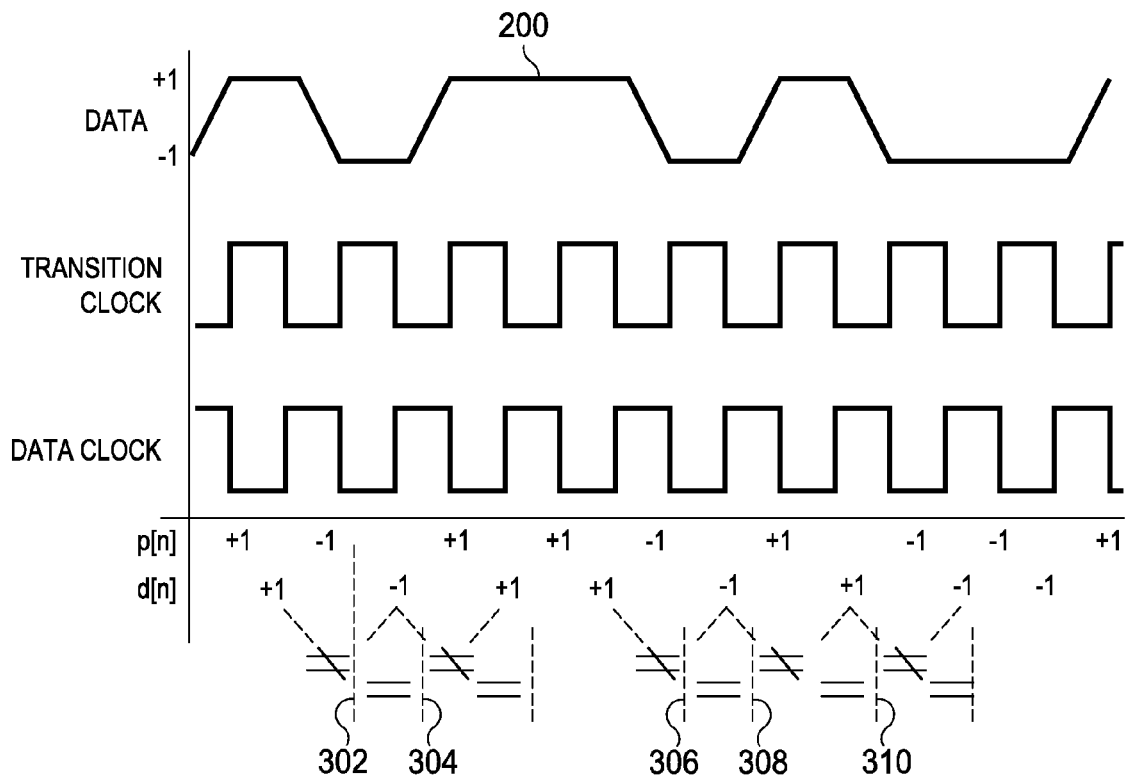
FIG. 3 is a timing diagram of an example operation in which recovered clocks are late.

FIG. 3 is a timing diagram of an example operation in which recovered clocks of the CDR circuit 108 are late. Similar to FIG. 2, the diagram of FIG. 3 spans eight (8) consecutive bit times across a horizontal axis of increasing time (left to right) for the data stream 200, the transition clock, the data clock, the edge samples p[n], and the center samples d[n].

In response to rising edges of the transition clock, the CDR circuit 108 obtains the edge samples p[n]. If a sign (e.g., polarity) of the data stream 200 is positive during a rising edge of the transition clock, then the CDR circuit 108 determines that a digital one (1) has been received for such rising edge's corresponding edge sample p[n]. Conversely, if the sign of the data stream 200 is negative during the rising edge of the transition clock, then the CDR circuit 108 determines that a digital zero (0) has been received for such rising edge's corresponding edge sample p[n].

In response to rising edges of the data clock, the CDR circuit 108 obtains the center samples d[n]. If the sign of the data stream 200 is positive during a rising edge of the data clock, then the CDR circuit 108 determines that a digital one (1) has been received for such rising edge's corresponding center sample d[n]. Conversely, if the sign of the data stream 200 is negative during the rising edge of the data clock, then the CDR circuit 108 determines that a digital zero (0) has been received for such rising edge's corresponding center sample d[n].

In the example of FIG. 2, at the bit times 202, 204, 206, 208, 210, 212 and 214, the CDR circuit 108 detects "early" events where a center sample d[n] and its respective contemporaneous edge sample p[n] have different values. In the example of FIG. 3, at the bit times 302, 304, 306, 308 and 310, the CDR circuit 108 detects "late" events where both: (a) a center sample d[n] and its immediately preceding center sample d[n−1] have different values; and (b) the center sample d[n] and its respective contemporaneous edge sample p[n] have a same value.

Within a particular number (e.g., 8) of consecutive bit times, the CDR circuit 108 counts: (a) a number of detected "early" events; and (b) a number of detected "late" events. In response to the counted number of detected "early" events being greater than the counted number of detected "late" events (within the particular number of consecutive bit times), the clock recovery component 118 of the CDR circuit 108: (a) determines that the transition clock and the data clock are early; and (b) accordingly, delays the phases of the transition clock and the data clock to make them less early. Conversely, in response to the counted number of detected "late" events being greater than the counted number of detected "early" events (within the particular number of consecutive bit times), the clock recovery component 118 of the CDR circuit 108: (a) determines that the transition clock and the data clock are late; and (b) accordingly, advances the phases of the transition clock and the data clock to make them less late. By comparison, in response to the counted number of detected "late" events being equal to the counted number of detected "early" events (within the particular number of consecutive bit times), the clock recovery component 118 of the CDR circuit 108: (a) determines that the transition clock and the data clock are neither early nor late; and (b) accordingly, maintains (e.g., neither delays nor advances) the phases of the transition clock and the data clock.

Figure 4:
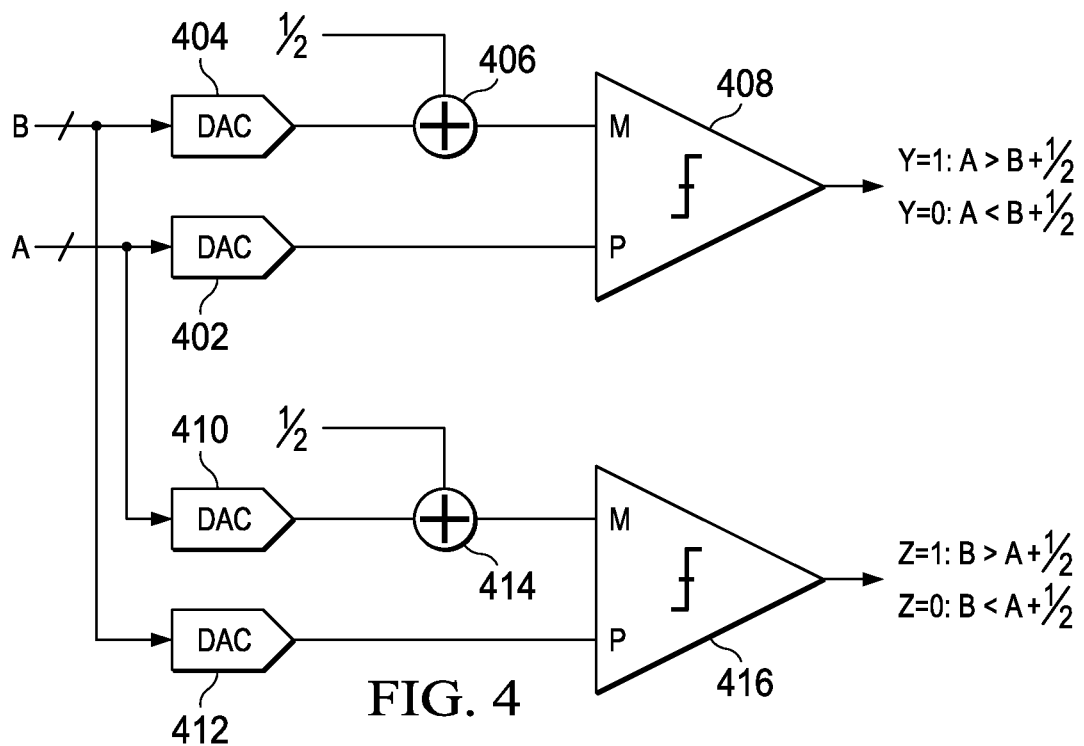
FIG. 4 is a block diagram of circuitry for counting and comparing: (a) a number of detected "early" events; and (b) a number of detected "late" events.

FIG. 4 is a block diagram of circuitry within the CDR 108 for counting and comparing: (a) the number of detected "early" events; and (b) the number of detected "late" events. In this example, for eight (8) consecutive bit times t (where t is an integer that ranges from 1 through i=8), the CDR circuit 108 stores: (a) a digital value A, which represents a number of "early" events as a linear array of i=8 bits At, where At=1 indicates that the CDR circuit 108 detected an "early" event during the bit time t, and where At=0 indicates that the CDR circuit 108 did not detect an "early" event during the bit time t; and (b) a digital value B, which represents a number of "late" events as a linear array of i=8 bits Bt, where Bt=1 indicates that the CDR circuit 108 detected a "late" event during the bit time t, and where Bt=0 indicates that the CDR circuit 108 did not detect a "late" event during the bit time t.

Accordingly, for the bit time t: (a) if At=1, then by definition Bt=0; and (b) if Bt=1, then by definition At=0.

As shown in FIG. 4, a digital-to-analog converter ("DAC") 402 receives A, which the DAC 402 converts into a corresponding analog voltage signal, so that: (a) if all eight (8) bits At have a binary logic 0 state, then such analog voltage signal has a smallest value MinV; (b) if all eight (8) bits At have a binary logic 1 state, then such analog voltage signal has a highest value MaxV; and (c) if an integer number n of the eight (8) bits At have a binary logic 1 state, then such analog voltage signal has a value=n/8*(MaxV−MinV). Similarly, a DAC 404 receives B, which the DAC 404 converts into a corresponding analog voltage signal, so that: (a) if all eight (8) bits Bt have a binary logic 0 state, then such analog voltage signal has the smallest value MinV; (b) if all eight (8) bits Bt have a binary logic 1 state, then such analog voltage signal has the highest value MaxV; and (c) if an integer number n of the eight (8) bits Bt have a binary logic 1 state, then such analog voltage signal has a value=n/8*(MaxV−MinV). Accordingly, one bit of At is a smallest increment of binary measurement in At. Likewise, one bit of Bt is a smallest increment of binary measurement in Bt.

An adder 406: (a) receives the analog voltage signal from the DAC 404; and (b) augments that signal's value by a voltage amount of 1/16*(MaxV−MinV), which is the voltage amount that equates to one-half (or approximately one-half) of the smallest increment of binary measurement in Bt (e.g., the voltage amount that is approximately one-half of what is contributed to that signal's value by any single one of the eight (8) bits Bt having a binary logic 1 state). A comparator 408 receives: (a) such augmented signal ("M"); and (b) the analog voltage signal from the DAC 402 ("P").

In response to P>M (e.g., A>B+½), the comparator 408 outputs Y=1, indicating that the transition clock and the data clock are early. Conversely, in response to M>P (e.g., A<B+½), the comparator 408 outputs Y=0, indicating that the transition clock and the data clock are not early (and possibly late). By definition, at the comparator 408, M does not equal P, because A does not equal B+½.

Further, as shown in FIG. 4, a DAC 410 receives A, which the DAC 410 converts into a corresponding analog voltage signal, in the same manner as the DAC 402. Similarly, a DAC 412 receives B, which the DAC 412 converts into a corresponding analog voltage signal, in the same manner as the DAC 404.

An adder 414: (a) receives the analog voltage signal from the DAC 410; and (b) augments that signal's value by a voltage amount of 1/16*(MaxV−MinV), which is the voltage amount that equates to one-half (or approximately one-half) of the smallest increment of binary measurement in At (e.g., the voltage amount that is approximately one-half of what is contributed to that signal's value by any single one of the eight (8) bits At having a binary logic 1 state). A comparator 416 receives: (a) such augmented signal ("M"); and (b) the analog voltage signal from the DAC 412 ("P").

In response to P>M (e.g., B>A+½), the comparator 416 outputs Z=1, indicating that the transition clock and the data clock are late. Conversely, in response to M>P (e.g., B<A+½), the comparator 416 outputs Z=0, indicating that the transition clock and the data clock are not late (and possibly early). By definition, at the comparator 416, M does not equal P, because B does not equal A+½.

Accordingly, if A>B, then Y=1 and Z=0, indicating that the transition clock and the data clock are early. Conversely, if B>A, then Y=0 and Z=1, indicating that the transition clock and the data clock are late. By comparison, if A=B, then Y=0 and Z=0, indicating that the transition clock and the data clock are neither early nor late (e.g., properly aligned).

Figure 5:
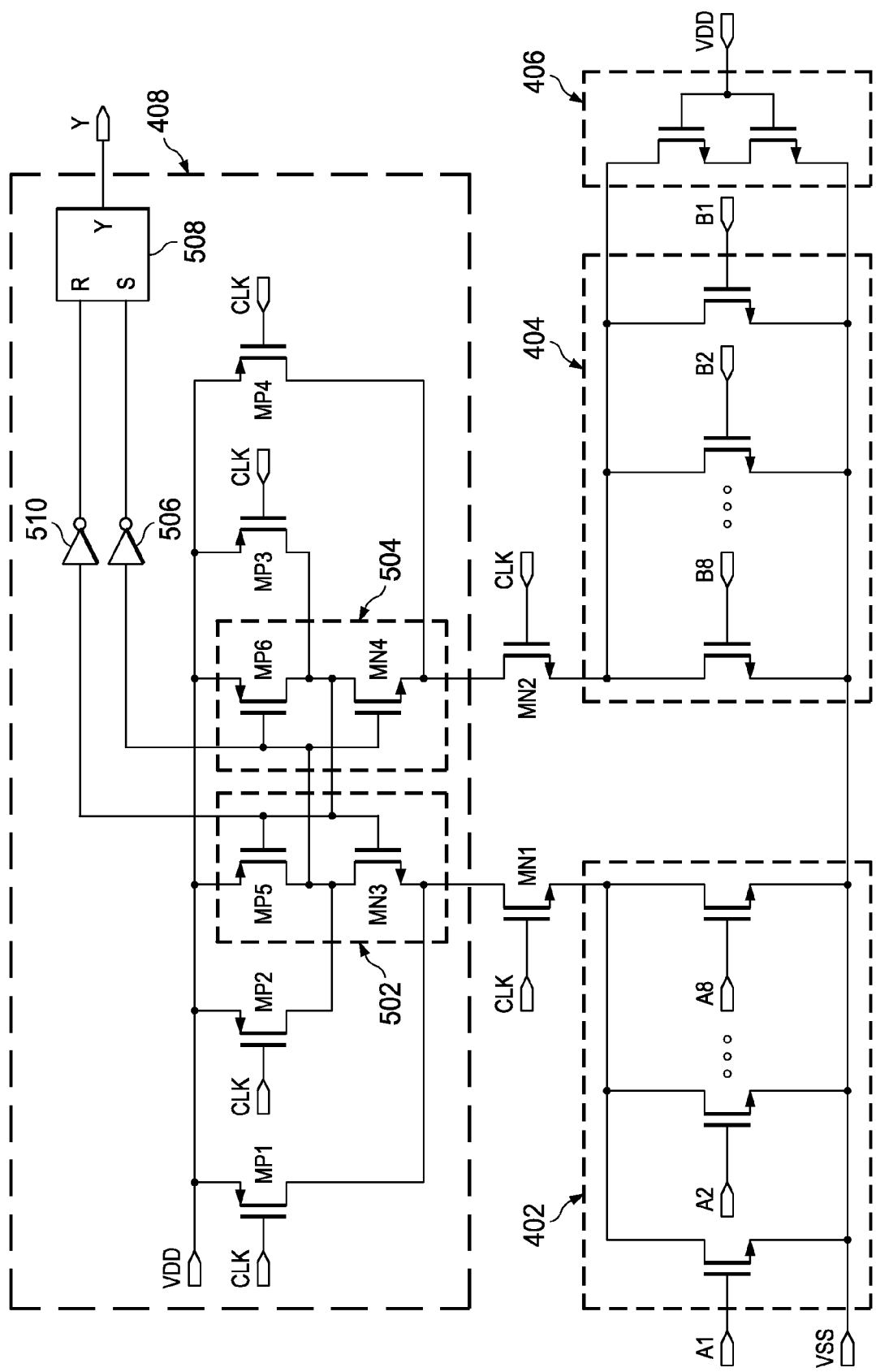
FIG. 5 is a schematic electrical circuit diagram of digital-to-analog converters, an adder, and a comparator of FIG. 4.

FIG. 5 is a schematic electrical circuit diagram of the DAC 402, the DAC 404, the adder 406 and the comparator 408. The DAC 402 includes a first set of eight (8) NMOS transistors, which are coupled in parallel to one another as shown in FIG. 5, so that: (a) sources of those transistors are connected to a voltage reference node VSS; (b) drains of those transistors are connected to a source of an NMOS transistor MN1; and (c) gates of those transistors are respectively connected to the eight (8) bits A1 through A8 (of the digital value A). The DAC 404 includes a second set of eight (8) NMOS transistors, which are coupled in parallel to one another as shown in FIG. 5, so that: (a) sources of those transistors are connected to VSS; (b) drains of those transistors are connected to a source of an NMOS transistor MN2; and (c) gates of those transistors are respectively connected to the eight (8) bits B1 through B8 (of the digital value B).

The adder 406 includes first and second NMOS transistors, which are coupled in series to one another as shown in FIG. 5, so that: (a) gates of those transistors are connected to a voltage supply node VDD; (b) the first NMOS transistor's source is connected to VSS; (c) the second NMOS transistor's drain is connected to the source of the transistor MN2; and (d) the first NMOS transistor's drain is connected to the second NMOS transistor's source. Accordingly, the DAC 402, the DAC 404 and the adder 406 together have a combined total of 2i+2 NMOS transistors. The various transistors of the DAC 402, the DAC 404 and the adder 406 have sizes that are approximately equal to one another.

The comparator 408 includes PMOS transistors MP1, MP2, MP3, MP4, MP5 and MP6, whose sources are connected to VDD. Also, the comparator 408 includes NMOS transistors MN3 and MN4. A source of the transistor MN3 is connected to drains of the transistors MP1 and MN1. A source of the transistor MN4 is connected to drains of the transistors MP4 and MN2.

A clock node CLK is connected to gates of the transistors MP1, MP2, MP3, MP4, MN1 and MN2. The transistors MP5 and MN3 together form a CMOS inverter 502, so that: (a) drains of the transistors MP5 and MN3 are connected to one another, as an output of the inverter 502; and (b) gates of the transistors MP5 and MN3 are connected to one another, as an input of the inverter 502. The transistors MP6 and MN4 together form a CMOS inverter 504, so that: (a) drains of the transistors MP6 and MN4 are connected to one another, as an output of the inverter 504; and (b) gates of the transistors MP6 and MN4 are connected to one another, as an input of the inverter 504.

The inverters 502 and 504 together form a latch (similar to a sense amplifier), so that: (a) the output of the inverter 502 is connected to the input of the inverter 504; and (b) the output of the inverter 504 is connected to the input of the inverter 502. Also, the output of the inverter 502 is: (a) connected to a drain of the transistor MP2; and (b) coupled through an inverter 506 to a set ("S") input of a set/reset ("SR") flip-flop 508. Further, the output of the inverter 504 is: (a) connected to a drain of the transistor MP3; and (b) coupled through an inverter 510 to a reset ("R") input of the flip-flop 508.

In operation, VSS is connected to a ground, and VDD is connected to a positive voltage source. In response to a clock signal, CLK periodically cycles between: (a) a first state of operation, in which CLK has approximately the VSS voltage; and (b) a second state of operation, in which CLK has approximately the VDD voltage. In the first state of operation: (a) the transistors MP1, MP2, MP3 and MP4 are substantially turned on; and (b) the transistors MN1 and MN2 are substantially turned off. Conversely, in the second state of operation: (a) the transistors MP1, MP2, MP3 and MP4 are substantially turned off; and (b) the transistors MN1 and MN2 are substantially turned on. During the first and second states of operation, the adder 406 transistors are substantially turned on.

During the first state of operation: (a) the transistor MP1 charges the source of the transistor MN3 to approximately the VDD voltage; (b) the transistor MP2 charges the output of the inverter 502 to approximately the VDD voltage, so that the S input of the flip-flop 508 is cleared to a binary logic 0 state; (c) the transistor MP3 charges the output of the inverter 504 to approximately the VDD voltage, so that the R input of the flip-flop 508 is cleared to a binary logic 0 state; and (d) the transistor MP4 charges the source of the transistor MN4 to approximately the VDD voltage.

During the first and second states of operation: (a) the DAC 402 receives the bits A1 through A8, so that none, some or all of the DAC 402 transistors are substantially turned on in response to such bits' respective binary logic states; and (b) the DAC 404 receives the bits B1 through B8, so that none, some or all of the DAC 404 transistors are substantially turned on in response to such bits' respective binary logic states.

During the second state of operation: (a) if at least one of the DAC 402 transistors is substantially turned on, then the transistor MN1 and the DAC 402 together at least partially reduce voltage at the source of the transistor MN3, according to a number of the DAC 402 transistors that is/are substantially turned on; and (b) irrespective of whether any of the DAC 404 transistors is substantially turned on, the transistor MN2, the DAC 404 and the adder 406 together at least partially reduce voltage at the source of the transistor MN4, according to a number of the DAC 404 transistors that is/are substantially turned on. For example, during the second state of operation, if each DAC 402 transistor (when substantially turned on) has a resistance RSW, then: (a) in response to half of the DAC 402 transistors being substantially turned on, the DAC 402 generates RSW/4 resistance between VSS and the source of the transistor MN1; and (b) in response to all of the DAC 402 transistors being substantially turned on, the DAC 402 generates RSW/8 resistance between VSS and the source of the transistor MN1.

Resistance between VSS and the source of the transistor MN1 varies in response to an integer number n of the eight (8) bits At that have a binary logic 1 state. Resistance between VSS and the source of the transistor MN2 varies in response to an integer number n of the eight (8) bits Bt that have a binary logic 1 state, plus resistance from the adder 406. Accordingly, during the second state of operation, the adder 406 ensures that resistance between VSS and the source of the transistor MN2 is unequal to resistance between VSS and the source of the transistor MN1.

During the second state of operation, the transistors MN1 and MN2 are substantially turned on, so: (a) resistance between VSS and the source of the transistor MN3 is controlled by the DAC 402; and (b) resistance between VSS and the source of the transistor MN4 is controlled by the DAC 404 and the adder 406. Accordingly, during the second state of operation, the inverters 502 and 504 operate to latch the S and R inputs of the flip-flop 508, so that: (a) in response to resistance at the source of the transistor MN3 being lower than resistance at the source of the transistor MN4, the inverters 502 and 504 operate to latch the S input at a binary logic 1 state and the R input at a binary logic 0 state, so that Y=1; and (b) conversely, in response to resistance at the source of the transistor MN4 being lower than resistance at the source of the transistor MN3, the inverters 502 and 504 operate to latch the S input at a binary logic 0 state and the R input at a binary logic 1 state, so that Y=0.

In the illustrative embodiment, the DAC 410, the DAC 412, the adder 414 and the comparator 416 have the same electrical circuit implementation as the DAC 404, the DAC 402, the adder 406 and the comparator 408, respectively, of FIG. 5. Accordingly, the CDR 108 implements a differential analog circuit with current steering logic to determine, in parallel, whether Y=1 or Y=0, and whether Z=1 or Z=0.

In the example of FIG. 5, the CDR circuit 108 consumes no static current. Instead, it consumes power when the clock signal at CLK transitions: (a) from the binary logic 0 state to the binary logic 1 state (e.g., a positive edge); or (b) from the binary logic 1 state to the binary logic 0 state (e.g., a negative edge). The circuitry of FIG. 5 is relatively compact and scalable, and suitable for implementation in various design processes (e.g., bipolar, SiGe) with alternative design styles (e.g., CML, ECL, domino logic).

In an alternative embodiment: the DACs 402, 404, 410 and 412 are implemented by resistors instead of transistors, so that: (a) each bit At is coupled through a respective one of the DAC 402 resistors to the comparator 408; (b) each bit Bt is coupled through a respective one of the DAC 404 resistors to the comparator 408; (c) each bit At is coupled through a respective one of the DAC 410 resistors to the comparator 416; and (d) each bit Bt is coupled through a respective one of the DAC 412 resistors to the comparator 416. In such alternative embodiment: (a) the adder 406 is implemented by coupling the VDD voltage through a resistor (having approximately twice as much resistance as one of the DAC 404 resistors) to the comparator 408; and (b) the adder 414 is implemented by coupling the VDD voltage through a resistor (having approximately twice as much resistance as one of the DAC 410 resistors) to the comparator 416.

In another alternative embodiment, in the same manner as the CDR 108 compares A to B, the CDR 108 further compares A to a digital value C (e.g., which includes a linear array of i=8 bits Ct), and likewise compares B to C. For example, in such alternative embodiment, the CDR 108 outputs, in parallel: (a) J=1 in response to A>C+½; (b) J=0 in response to A<C+½; (c) K=1 in response to C>A+½; and (d) K=0 in response to C<A+½. By definition, A does not equal C+½, and C does not equal A+½. Accordingly: (a) if A>C, then J=1 and K=0; (b) if C>A, then J=0 and K=1; and (c) if A=C, then J=0 and K=0.

Similarly, in such alternative embodiment, the CDR 108 outputs, in parallel: (a) L=1 in response to B>C+½; (b) L=0 in response to B<C+½; (c) M=1 in response to C>B+½; and (d) M=0 in response to C<B+½. By definition, B does not equal C+½, and C does not equal B+½. Accordingly: (a) if B>C, then L=1 and M=0; (b) if C>B, then L=0 and M=1; and (c) if B=C, then L=0 and M=0.

Although illustrative embodiments have been shown and described by way of example, a wide range of alternative embodiments is possible within the scope of the foregoing disclosure.

What is claimed is:

1. A method performed by at least one device for comparing at least first and second digital values, wherein one bit is a smallest increment of binary measurement in the first and second digital values, the method comprising:
converting the first digital value into a first analog signal;
converting the second digital value into a second analog signal;
augmenting the first analog signal by a first amount that equates to less than the smallest increment of binary measurement, so that the augmented first analog signal by definition does not equal the second analog signal;
augmenting the second analog signal by a second amount that equates to less than the smallest increment of binary measurement, so that the augmented second analog signal by definition does not equal the first analog signal;
comparing the augmented first analog signal to the second analog signal, and outputting a first signal in response thereto;
comparing the augmented second analog signal to the first analog signal, and outputting a second signal in response thereto; and
determining, in response to the first and second signals, whether the first digital value is greater than the second digital value, whether the first digital value is less than the second digital value, and whether the first digital value is equal to the second digital value;
wherein the first digital value represents a number of times that a clock is early within a particular number of consecutive bit times, and wherein the second digital value represents a number of times that the clock is late within the particular number of consecutive bit times.

2. The method of claim 1, and comprising: delaying a phase of the clock in response to determining that the first digital value is greater than the second digital value; and advancing the phase of the clock in response to determining that the first digital value is less than the second digital value.

3. The method of claim 1, and comprising: in response to phase differences between the clock and transitions in a serial data stream, detecting the number of times that the clock is early within the particular number of consecutive bit times, and detecting the number of times that the clock is late within the particular number of consecutive bit times.

4. The method of claim 1, wherein the first digital value represents the number of times that the clock is early as a first linear array, wherein a number of bits in the first linear array equals the particular number of consecutive bit times, wherein the second digital value represents the number of times that the clock is late as a second linear array, and wherein a number of bits in the second linear array equals the particular number of consecutive bit times.

5. The method of claim 4, wherein if a bit t in the first linear array indicates that the clock is early during a bit time t, then by definition a bit t in the second linear array indicates that the clock is not late during the bit time t, wherein t is a positive integer number.

6. The method of claim 5, wherein if the bit t in the second linear array indicates that the clock is late during the bit time t, then by definition the bit t in the first linear array indicates that the clock is not early during the bit time t.

7. The method of claim 1, wherein the second amount approximately equals the first amount.

8. The method of claim 7, wherein the first amount equates to approximately one-half of the smallest increment of binary measurement.

9. A system for comparing at least first and second digital values, wherein one bit is a smallest increment of binary measurement in the first and second digital values, the system comprising:
at least one converter for: converting the first digital value into a first analog signal; and converting the second digital value into a second analog signal;
at least one device for: augmenting the first analog signal by a first amount that equates to less than the smallest increment of binary measurement, so that the augmented first analog signal by definition does not equal the second analog signal; and augmenting the second analog signal by a second amount that equates to less than the smallest increment of binary measurement, so that the augmented second analog signal by definition does not equal the first analog signal;

at least one comparator for: comparing the augmented first analog signal to the second analog signal, and outputting a first signal in response thereto; and comparing the augmented second analog signal to the first analog signal, and outputting a second signal in response thereto; and circuitry for determining, in response to the first and second signals, whether the first digital value is greater than the second digital value, whether the first digital value is less than the second digital value, and whether the first digital value is equal to the second digital value;

wherein the first digital value represents a number of times that a clock is early within a particular number of consecutive bit times, and wherein the second digital value represents a number of times that the clock is late within the particular number of consecutive bit times.

10. The system of claim 9, and comprising at least one component for: delaying a phase of the clock in response to determining that the first digital value is greater than the second digital value; and advancing the phase of the clock in response to determining that the first digital value is less than the second digital value.

11. The system of claim 9, and comprising circuitry for: in response to phase differences between the clock and transitions in a serial data stream, detecting the number of times that the clock is early within the particular number of consecutive bit times, and detecting the number of times that the clock is late within the particular number of consecutive bit times.

12. The system of claim 9, wherein the first digital value represents the number of times that the clock is early as a first linear array, wherein a number of bits in the first linear array equals the particular number of consecutive bit times, wherein the second digital value represents the number of times that the clock is late as a second linear array, and wherein a number of bits in the second linear array equals the particular number of consecutive bit times.

13. The system of claim 12, wherein if a bit t in the first linear array indicates that the clock is early during a bit time t, then by definition a bit t in the second linear array indicates that the clock is not late during the bit time t, wherein t is a positive integer number.

14. The system of claim 13, wherein if the bit t in the second linear array indicates that the clock is late during the bit time t, then by definition the bit t in the first linear array indicates that the clock is not early during the bit time t.

15. The system of claim 9, wherein the second amount approximately equals the first amount.

16. The system of claim 15, wherein the first amount equates to approximately one-half of the smallest increment of binary measurement.

17. A system for comparing at least first and second digital values, wherein one bit is a smallest increment of binary measurement in the first and second digital values, wherein the first digital value represents a number of times that a clock is early within a particular number of consecutive bit times, and wherein the second digital value represents a number of times that the clock is late within the particular number of consecutive bit times, the system comprising:

circuitry for: in response to phase differences between the clock and transitions in a serial data stream, detecting the number of times that the clock is early within the particular number of consecutive bit times, and detecting the number of times that the clock is late within the particular number of consecutive bit times;

at least one converter for: converting the first digital value into a first analog signal; and converting the second digital value into a second analog signal;

at least one device for: augmenting the first analog signal by a first amount that equates to less than the smallest increment of binary measurement, so that the augmented first analog signal by definition does not equal the second analog signal; and augmenting the second analog signal by a second amount that equates to less than the smallest increment of binary measurement, so that the augmented second analog signal by definition does not equal the first analog signal;

at least one comparator for: comparing the augmented first analog signal to the second analog signal, and outputting a first signal in response thereto; and comparing the augmented second analog signal to the first analog signal, and outputting a second signal in response thereto;

circuitry for determining, in response to the first and second signals, whether the first digital value is greater than the second digital value, whether the first digital value is less than the second digital value, and whether the first digital value is equal to the second digital value;

at least one component for: delaying a phase of the clock in response to determining that the first digital value is greater than the second digital value; and advancing the phase of the clock in response to determining that the first digital value is less than the second digital value.

18. The system of claim 17, wherein the first digital value represents the number of times that the clock is early as a first linear array, wherein a number of bits in the first linear array equals the particular number of consecutive bit times, wherein the second digital value represents the number of times that the clock is late as a second linear array, and wherein a number of bits in the second linear array equals the particular number of consecutive bit times.

19. The system of claim 18, wherein if a bit t in the first linear array indicates that the clock is early during a bit time t, then by definition a bit t in the second linear array indicates that the clock is not late during the bit time t, wherein t is a positive integer number.

20. The system of claim 19, wherein if the bit t in the second linear array indicates that the clock is late during the bit time t, then by definition the bit t in the first linear array indicates that the clock is not early during the bit time t.

21. The system of claim 17, wherein the second amount approximately equals the first amount.

22. The system of claim 21, wherein the first amount equates to approximately one-half of the smallest increment of binary measurement.

* * * * *